United States Patent
Jefferies et al.

(10) Patent No.: US 9,654,106 B1
(45) Date of Patent: May 16, 2017

(54) DYNAMIC DIGITAL INPUT FILTERING

(71) Applicant: SCHNEIDER ELECTRIC USA, INC., Schaumburg, IL (US)

(72) Inventors: Kevin M. Jefferies, Raleigh, NC (US); Benjamin W. Edwards, Rolesville, NC (US); Matthew L. White, Raleigh, NC (US); Konstantin Alexander Filippenko, Grenoble (FR); Richard Karl Weiler, Wake Forest, NC (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 0 days.

(21) Appl. No.: 14/976,289

(22) Filed: Dec. 21, 2015

(51) Int. Cl.
*H03K 19/003* (2006.01)
*H03K 19/00* (2006.01)

(52) U.S. Cl.
CPC ... *H03K 19/0005* (2013.01); *H03K 19/00346* (2013.01)

(58) Field of Classification Search
CPC ............... H03K 19/0005; H03K 19/00346
USPC ............... 326/26, 30; 708/300, 314, 819
See application file for complete search history.

(56) References Cited

U.S. PATENT DOCUMENTS

| 5,150,317 | A | 9/1992 | Countryman | |
|---|---|---|---|---|
| 7,965,099 | B2 * | 6/2011 | Gusi | H04B 3/548 326/30 |
| 8,213,138 | B2 * | 7/2012 | Dougherty | G01R 31/026 361/42 |
| 2003/0201790 | A1 * | 10/2003 | Rajan | H04L 25/0278 326/30 |
| 2008/0030221 | A1 * | 2/2008 | Lee | H04L 25/0278 326/30 |
| 2015/0103951 | A1 * | 4/2015 | Hosseinzadeh-Shanjani | H04B 1/0475 375/297 |

* cited by examiner

*Primary Examiner* — Jason M Crawford
(74) *Attorney, Agent, or Firm* — Locke Lord LLP

(57) ABSTRACT

A dynamic digital filtering system for detecting electrical noise in a discrete I/O circuit. The dynamic digital filtering system has a controller for monitoring the logic signal produced by a logic device monitoring a remote I/O device. The logic device includes a circuit for dynamically adjusting the impedance across a power terminal and a terminal receiving a binary signal from the I/O device. Upon a change of state of the monitored logic signal the controller commands the impedance adjusting circuit to momentarily change its input impedance to determine if the binary signal responsible for the monitored change of state of the logic signal was true or false. If the monitored logic signal does not change state during the momentary change in impedance the binary signal will be verified as "true". If the monitored logic signal does change state during the momentary change in impedance the binary signal will be considered as "false".

2 Claims, 4 Drawing Sheets

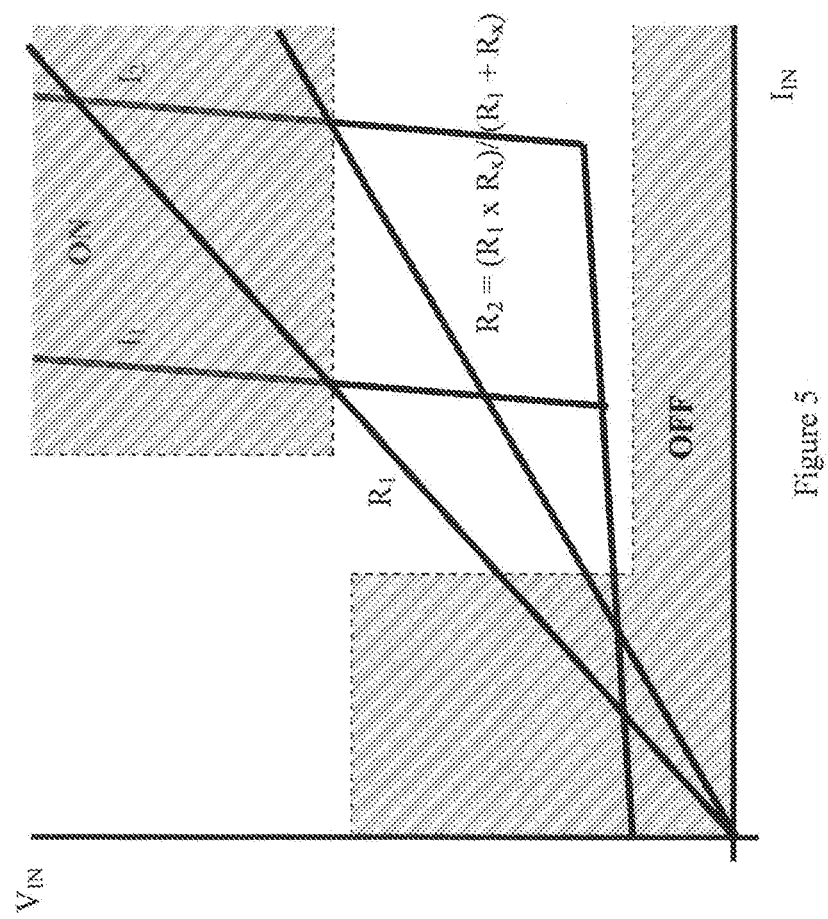

_US 9,654,106 B1_

DYNAMIC DIGITAL INPUT FILTERING

FIELD OF THE INVENTION

The invention is generally directed to digital inputs for industrial control systems and particularly to reducing electrical noise in the input circuit that can cause a false reading by the logic device receiving the binary signal.

BACKGROUND OF THE INVENTION

Control systems use discrete inputs and outputs (I/O) to communicate between devices, to pass information such as status or to issue commands. In comparison to communications networks, discrete I/O is seen as a less complex and costly solution in many applications that require simple yet reliable operation. Of particular interest is the design of binary input ports since these are probably the most widely used input port types in control equipment. These input ports must be designed to differentiate between at least two specific signal levels.

FIG. 1 illustrates a simplified view of a discrete input/output circuit 10 of the prior art in which a remote device 14 is monitored by a binary input port identified in FIG. 1 as a logic device 18. The remote device 14, logical device 18 and a power supply 22 are connected electrically in series by a first conductor 26 connected between a first terminal 30 of the power supply 22 and first terminal 34 of the remote device 14, a second conductor 38 connected between a second terminal 42 or the remote device 14 and a first terminal 46 of the logic device 18, and a third conductor 50 connected between a second terminal 54 of the logic device 18 and a second terminal 58 of the power supply 22. The remote device 14 consists of a two-state switch S1 (either electromechanical or solid-state) that when open interrupts the flow of power from a power supply 22 to the logic device 18 and when closed, completes the circuit path between the power supply 22 and the logic device 18. The logic device 18 senses the presence or absence of voltage from the power supply 22 across terminals 46 and 54 of the logic device 18 and translates these voltage levels into logic signals for use by a control system.

For the following discussions, when the state of switch S1 in the remote device 14 is closed and voltage from the power supply 22 is present across the logic device 18 input terminals 46 and 54 this state will be referred to as the "ON state" or "active state" of the circuit 10 or logic device 18. When the state of switch S1 of the remote device 14 is open and voltage from the power supply 22 is not present across the terminals 46 and 54 of logic device 18 will be referred to as the "OFF state" or "inactive state" of the circuit 10 or logic device 18.

Since the logic device 18 has impedance associated with the path between its terminals 46 and 54, when the remote device 14 switch S1 closes, a current will flow around the circuit 10 consisting of the power supply 22, remote device 14 and logic device 18. The impedance of the overall circuit 10 and the power supply 22 voltage magnitude will determine the current amplitude and other characteristics. For the circuit 10 shown in FIG. 1, the power supply 22 can be either AC or DC.

The ability to differentiate signal levels is made difficult by the presence of electrical noise found in the operating environment of the system 10. In FIG. 1, the remote device 14 can be a considerable distance from the logic device 18 and the interconnecting conductors 26 and 38 are subjected to local electrical field phenomenon known as electrical noise. Many forms of electrical noise exist that can become entwined with the received signals thereby corrupting the signal integrity. Induction and capacitive coupling of signals or impulses from adjacent circuits is possible. Additionally, current leakage (either galvanic or displacement) across or through insulation of the conductors 26 and 38 or devices 14 and 18 represent a form of electrical interference sometimes classified as noise. Other forms of electrical noise can be present and are well known to those skilled in the art.

Referring now to FIG. 2, a large classification of electrical noise can be represented by a Thevenin equivalent circuit 62 attached between conductors 26 and 38 and effectively shunts the remote device 14. The Thevenin voltage source can represent noise signals of various types (periodic, non-periodic), waveshapes (sinusoidal, impulsive, rectangular, etc.), frequencies or amplitudes. The Thevenin voltage source provides the driving energy to disturb the circuit. The associated Thevenin impedance determines how tightly coupled are the noise signals to the circuit 10. For a Thevenin noise model, if the impedance of the logic device 18 is equal to the Thevenin impedance and the Thevenin noise voltage is of the same magnitude and polarity of the power supply 22, a voltage equivalent to the power supply 22 voltage will be applied across the logic device 18 input terminals 46 and 54. This voltage will cause the logic device 18 to report an incorrect ON or OFF state of the remote device 14 switch S1.

From a system perspective, proper selection of the operational signal levels, signal detection thresholds, input impedance and response time all determine the effectiveness of the logic device 18 to reliably receive information in the presence of the environmental electrical noise. For instance, if the impedance across the logic device 18 was small compared to the Thevenin impedance (say $\frac{1}{100}$ of $Z_T$), then only $\frac{1}{100}$ of the Thevenin noise voltage would be present across the logic device 18 input terminals 46 and 54. Such a reduction in noise voltage greatly increases the ability of the logic device 18 to resolve the correct ON or OFF state of the remote device 18 switch S1.

Reducing the impedance of the logic device 18 with respect to the noise source impedance while very effective, does have limitations. The lower the impedance, the more current will flow around the circuit 10 when the remote device 14 switch S1 is closed. The increased current places a greater power burden on the power supply 22 and causes additional heat dissipation in both the power supply 22 and logic device 18. Therefore, it becomes desirable to set the logic device 18 impedance as high as possible while still minimizing the effects of noise on the state of the circuit 10. The desirability of attaining this goal increases greatly as the number of logic devices 18 present increases.

Additionally, the designer must deal with a number of other constraints in the logic devices 18. These include but are not limited to internal heating, channel density, signal integrity issues, speed, and cost. These constraints are normally in direct opposition to each other. For example, simple designs will allow for a low cost, but can cause an unacceptably large power dissipation requiring additional methods to remove the wasted heat; while low power designs minimize the heating issues but require higher part counts.

SUMMARY OF THE INVENTION

The purpose of this invention is to decrease the power requirement and increase the power efficiency of digital input/output systems while maintaining integrity of the signal detection when operating in an electrically noisy environment.

A dynamic digital input filtering system comprising:
a power supply;
a remote device having a two-state switch;
a logic device having an impedance adjusting circuit electrically in series with the power supply and the two-state switch of the remote device, the logic device producing a logic signal based on a binary signal sent by the two-state switch of the remote device; and
a control device monitoring the logic signal of the logic device and adjusting the impedance of the impedance adjusting circuit in response to a change of state of the monitored logic signal.

A method for dynamically filtering noise at a discrete digital input/output device comprising the steps of:
monitoring, by a controller, a logic signal produced by a logic device in response to a binary signal received from a remote device at an input terminal of an impedance adjusting circuit of the logic device;
detecting, by the controller, a change in state of the logic signal;
initiating, by the controller, a momentary change in the impedance of the impedance adjusting circuit;
monitoring, by the controller, the logic signal for a change in state during the momentary change in impedance;
determining, by the controller, if the monitored change of state of the logic signal was due to a change in state of the received binary signal.

BRIEF DESCRIPTION OF THE DRAWINGS

FIG. 5 is a graphical representation of the input voltage versus input current characteristic of the circuits of FIGS. 3 and 4.

DETAILED DESCRIPTION OF THE INVENTION

Figure 1:
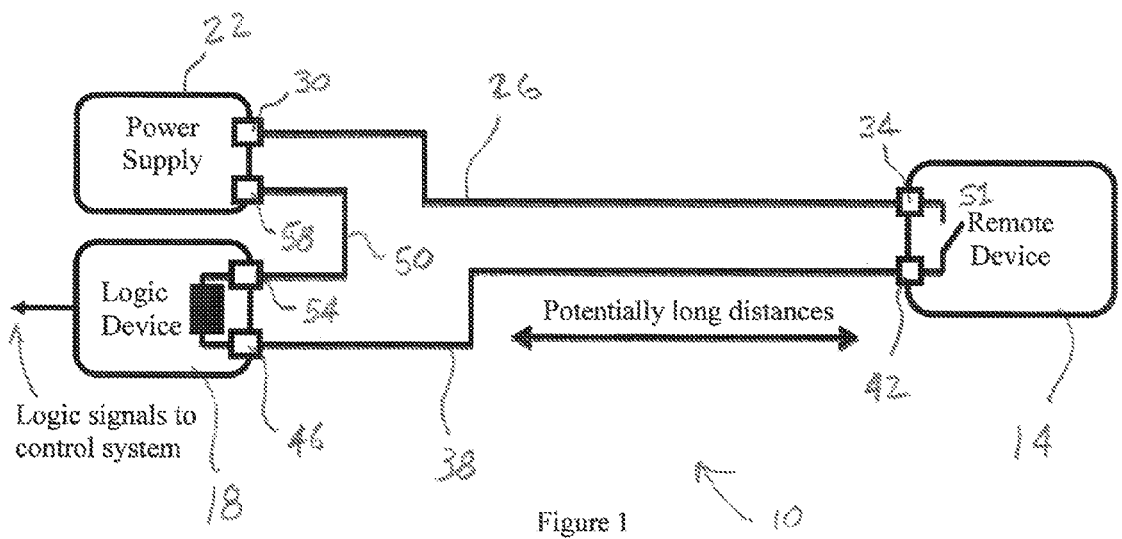
FIG. 1 is a noise filter circuit of the prior art
Figure 2:
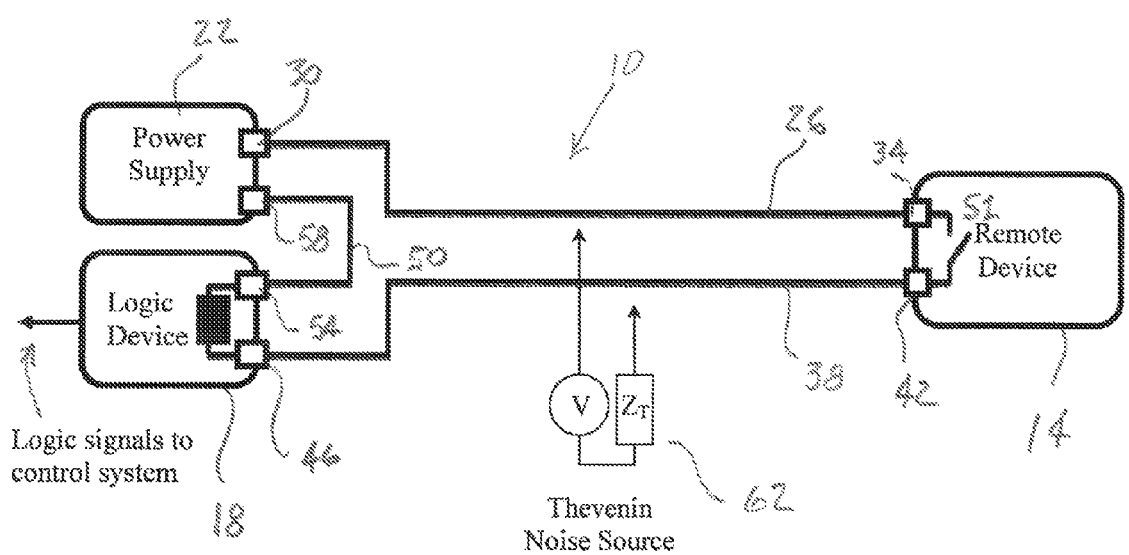
FIG. 2 is a noise filter circuit of the prior art
Figure 3:
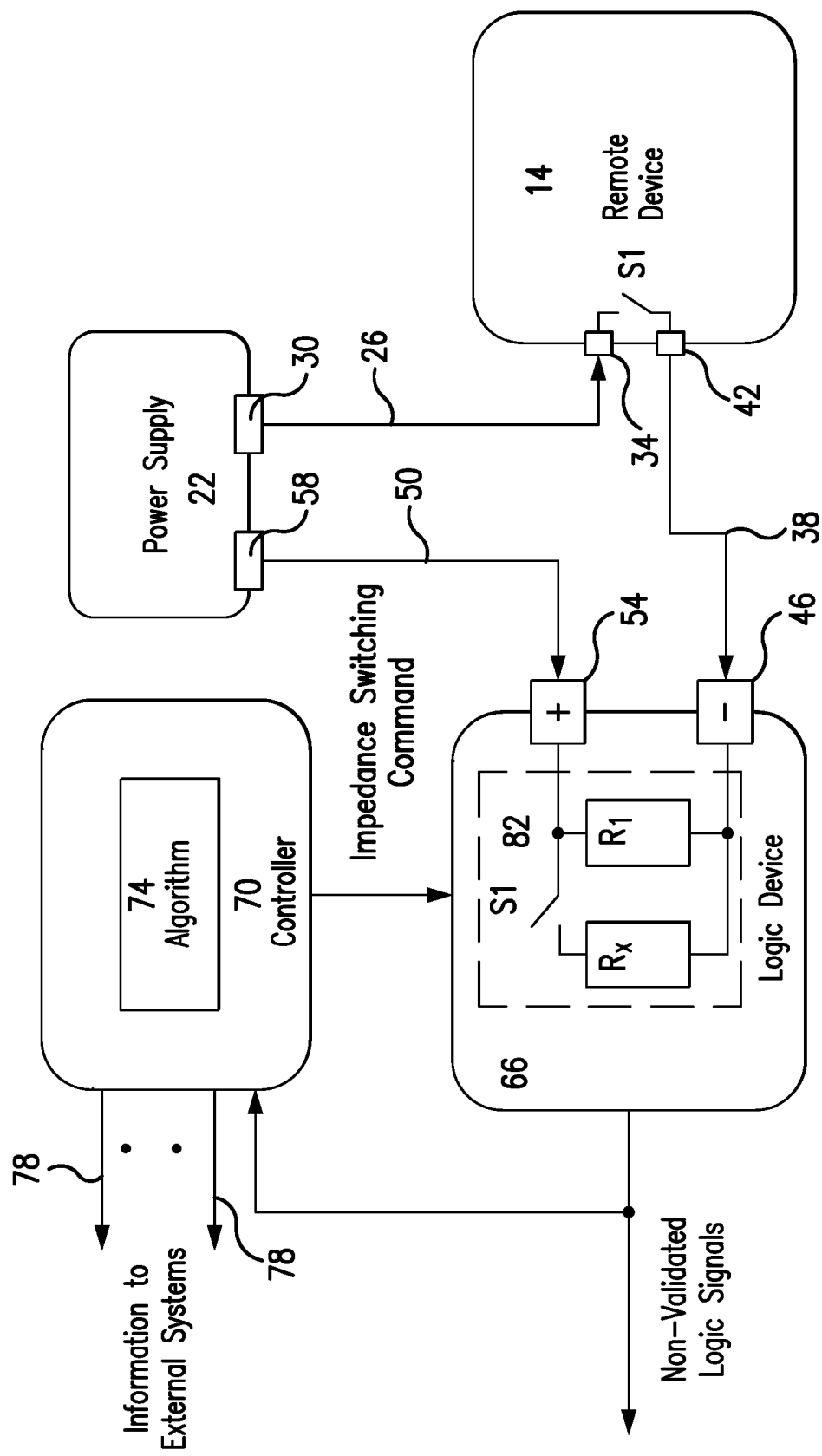
FIG. 3 is a first embodiment of a logic device for the dynamic digital input filter of the present invention.
Figure 4:
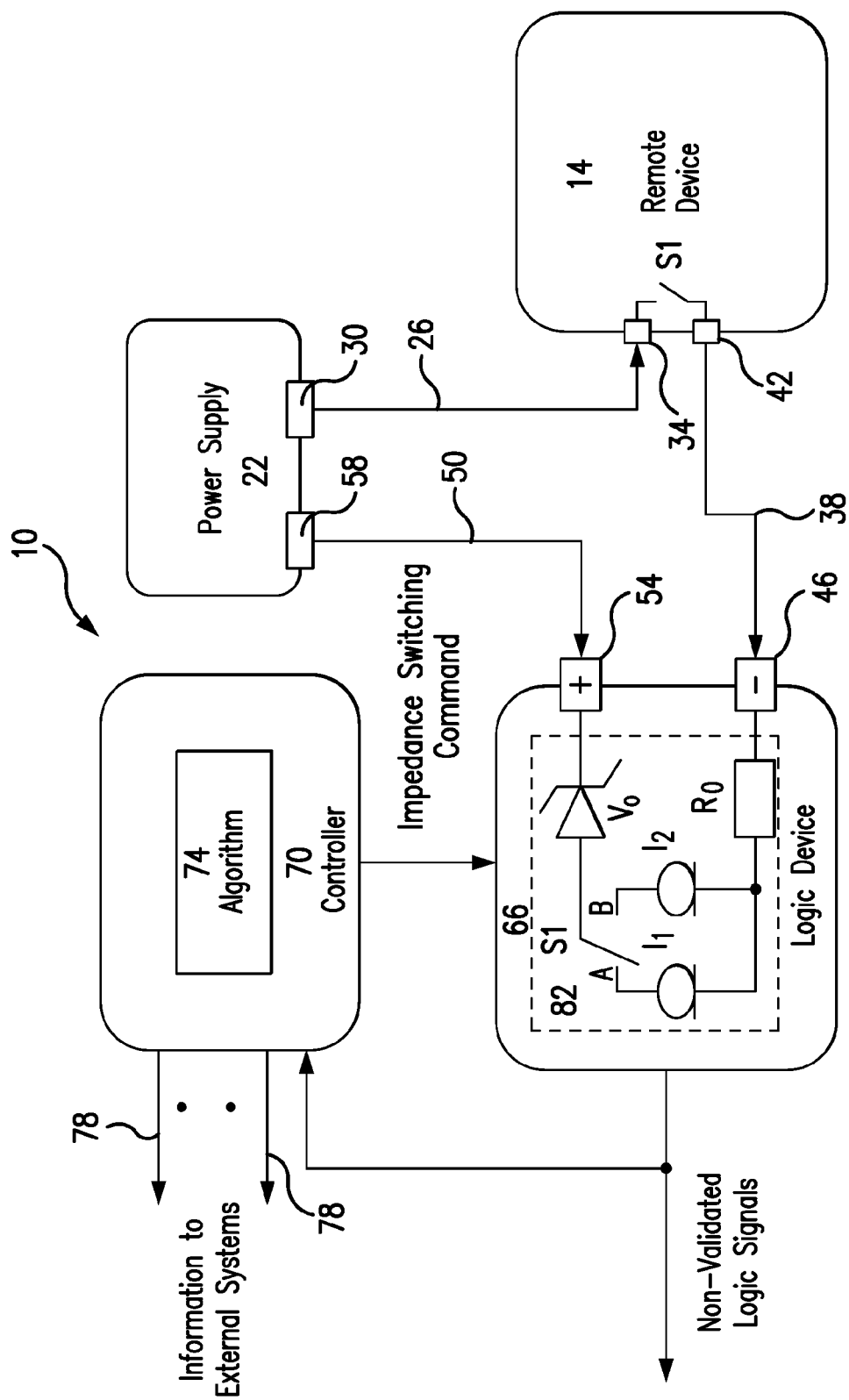
FIG. 4 is a second embodiment of a logic device for the dynamic digital input filter of the present invention.

The method and apparatus described herein form a Dynamic Digital Input Filtering system whose purpose is to improve signal integrity at a binary digital input port identified in the FIGS. 3 and 4 as a logic device 66, while minimizing power noise environments, high input impedance would be set while a high electrical noise environment would necessitate setting the impedance to a lower value. This allows for a reduction of power consumption and heat dissipation in the impedance of the logic device 66 for situations where a low electrical noise environment exists. Additionally, as the electrical noise environment changes (e.g., control system is part of mobile equipment, aging of interconnecting cables, physical modifications to remote device 18 wiring, etc.), the logic device 66 can adapt to these changes. Specifically, this is accomplished by dynamically adjusting the input impedance of the logic device 66 in response to the existing electrical noise environment. The state of the electrical noise environment is based on monitoring the state perturbations of the logic device 66 output and deciding whether the input impedance of a specific logic device 66 can be increased or decreased. With respect to FIG. 1, the method is applicable to signal systems that use direct current signals or alternating current signals. One or a multiplicity of logic devices 66 can be present, each with its own remote device 14. A single or multiple power supplies 22 can be present and power supply conductors 26 and 38 can be shared when more than one remote device 14 is present.

For the purpose of example embodiments, two methods of adjusting the logic device 66 impedance are illustrated in FIGS. 3 and 4. However, adjustability of the input impedance of the logic device 66 can be accomplished using the method described herein for controlling devices such as infinitely adjustable or multi-step resistors, rheostats or potentiometers or some types of solid state devices such as a MOSFET where its channel resistance can be modulated by electrical command and some types of electron emission devices such as a triode vacuum tube where the conductance can be varied by electrical command. To clarify the operation of interest, an impedance adjusting circuit 82 for adjusting the impedance across input terminals 46 and 54 of logic device 66, is illustrated but the threshold sensing circuitry that reports the state of the voltage across or current through the impedance adjusting circuit 82 of the logic device 66 is not shown.

FIG. 3 illustrates a logic device 66, having an impedance adjusting circuit 82 of the present invention, whose input impedance can be modified by closing and opening switch S1 of the impedance adjusting circuit 82. When the switch S1 is open, the impedance of the logic device 66 input is $R_1$. With the switch S1 closed, the impedance is reduced to a value $R_2$. $R_2$ is equal to the parallel combination of $R_1$ and $R_x$, $R_2 = (R_1 \times R_x)/(R_1 + R_x)$. The graph of FIG. 5 illustrates the input voltage versus input current characteristic of the FIG. 3 logic device 66. The two shaded areas of the graph labeled OFF and ON represent input voltage and corresponding input current values where the logic device 66 threshold sensing circuitry (not shown) will detect the circuit 10 state (remote device 14 state) as either OFF or ON. The non-shaded area of the graph represents voltage and current values where the circuit 10 state (either OFF or ON) remains unchanged. Two lines labeled $R_1$ and $R_2$ represent the impedance of the logic device 66 with impedance adjusting circuit 82 switch S1 open or closed, respectively. It can be seen from the graph that for the same value of input voltage ($V_{IN}$) applied to either $R_1$ or $R_2$ impedance line, $R_2$ will draw more current than $R_1$. Therefore circuit operation on the $R_2$ impedance line consumes more power and generates more heat that must be dissipated. However, the reduced impedance of $R_2$ can help alleviate spurious transitions of the logic output of logic device 66 when the remote device 14 or associated conductors 26 and 38 are located in electrically noisy environments.

FIG. 4 illustrates a second logic device 66 of the present invention whose input impedance can also be modified by setting its impedance adjusting circuit 82 switch S1 to position A or B. This impedance adjusting circuit 82 is composed of a Zener diode $V_0$ seriesed with a resistor $R_0$ and two switch-selectable current limiting diodes $I_1$ and $I_2$. The impedance adjusting circuit 82 found in this logic device 66 provides a non-linear impedance characteristic that can be adjusted to limit power consumption. With switch S1 in the A position, the current that can flow through the seriesed impedance adjusting circuit 82 components is limited by current limiting diode $I_1$. With switch S1 in the B position, the current that can flow through the seriesed impedance adjusting circuit 82 components is limited by current limiting diode $I_2$. For purposes of discussion, diode $I_1$ is more current limiting than diode I$_2$. In other words, diode I$_2$ will allow greater current flow through the impedance adjusting circuit 82 components than I$_1$. The graph of FIG. 5 also illustrates the input voltage versus input current characteristic of the FIG. 4 logic device 66. The two lines labeled I$_1$ and I$_2$ that converge to form a single line represent the impedance of the logic device 66 with the switch S1 in position A or B respectively. It can be seen from the graph that for the same value of input voltage (V$_{IN}$) applied to the region of the impedance curve selected by switch S1, the B switch position, line I$_2$ will allow more current than the A position, line I$_1$. Therefore circuit operation on the I$_2$ impedance line consumes more power and generates more heat that must be dissipated. However, the increased current limit of I$_2$ can help alleviate spurious transitions of the logic output of logic device 66 when the remote device 14 or associated conductors 26 and 38 are located in electrically noisy environments.

It should be noted that the impedance adjusting circuits 82 illustrated in both FIGS. 3 and 4 are shown with input polarity marks on the logic devices 66 input terminals 46 and 54 indicative of operation with a Direct Current circuit. However, both impedance adjusting circuits 82 and the associated threshold sensing circuitry (not shown) can be used on Alternating Current circuits with the inclusion of rectification means connected between the AC circuit and the logic device 66 input. The inclusion of rectification means is well known to those skilled in the art.

Additionally, it should be noted that while FIG. 3 and FIG. 4 impedance adjusting circuits 82 both have two possible impedance selections, the circuitry shown can be easily extended by anyone skilled in the art to allow for more than two selectable impedance values.

Control of the impedance of the logic device 66 input could be done manually by providing a Human Machine Interface (HMI) where a user could select the desired impedance level. However, the true value of the invention is in the ability to automatically determine when a higher impedance levels is warranted thereby minimizing power consumption and heat dissipation. Another feature is the ability to automatically determine whether the circuit associated with the specific logic device (e.g. associated conductors and remote device 14) may require service or repair.

To accomplish this adaptive control requires that the output logic signals of the logic device 66 must be monitored by some form of controller 70 that is executing an algorithm 74. The controller 70 then adjusts the impedance level of the impedance adjusting circuit 82 as determined by the algorithm 74. The controller 70 then provides additional output information via outputs 78 for use by external systems.

Referring to FIGS. 3 and 4, the apparatus and method employed are as follows:

A logic device 66 configured to receive a binary signal from a remote device 14 and convert the binary signal to a logic signal for use by a control system. The logic device 66 has impedance across its input terminals 46 and 54 that can be varied or changed between at least two values by a switching means S1 in the impedance adjusting circuit 82.

A controller 70 that 1) monitors the logic signals from the logic device 66 and 2) commands the switching means S1 of the impedance adjusting circuit 82 to change the value of impedance across the input terminals 46 and 54 of the logic device 66 in response to the logic signals from the logic device 66. One or more optional outputs 78 can be present to provide information from the controller 70 to other external systems.

An algorithm 74 or group of algorithms 74 executed by the controller 70 and designed to perform one or a combination of functions. The algorithm 74 consists of but is not limited to the following two textual descriptions that can be used separately or in combination.

A first algorithm 74 validates a state change of two-state switch S1 of remote device 14 by initializing switch S1 of the impedance adjusting circuit 82 to set the impedance across the logic device 66 input terminals 46 and 54 to the largest available impedance value (least power consumption, least electrical noise immunity). Monitoring the logic signals from logic device 66 for a change in output state (A change in output state of the logic signal indicates that either the two-state switch S1 of remote device 14 has changed state or electrical noise or damage to the remote device 14 or associated conductors 26 and 38 has caused a state change). Immediately following the monitored state change of the logic signal, momentarily command switch S1 of the impedance adjusting circuit 82 to set the impedance across the logic device 66 input terminals 46 and 54 to the smallest available impedance value (most power consumption, most electrical noise immunity). If the state of the monitored logic signal remains unchanged during the momentary period of time when the logic device 66 impedance is lowered, then the logic signal state of the logic device 66 likely represents the correct state of two-state switch S1 of the remote device 14 (remote device 14 signal validated). Otherwise if the monitored logic signal of the logic device 66 changes state during the momentary period of the application of the lower impedance, then the monitored logic signal state change of the logic device 66 was the likely result of electrical noise or damage to the remote device 14 or associated conductors 26 and 38 and not a state change of two-state switch S1 of the remote device 14 (remote device 14 signal invalidated). Upon restoration of the impedance to the largest impedance value, report to external systems via controller 70 outputs 78 that the received command from the remote device 14 has been validated or invalidated. The controller 70 continues to monitor the logic signals from the logic device 66 (repeat algorithm 74).

A second Algorithm 74 adjusts the impedance consistent with electrical noise environment by monitoring the logic signals from logic device 66 for changes in output state that meet one or more of the following criteria (Note that the values shown in the criteria are not limited to the examples given but must be appropriately selected by the system designer for the application being considered).

Short duration (e.g. less than 50 millisecond) state cycles (i.e. OFF-ON-OFF or ON-OFF-ON) whose average rate (state cycles/sec) exceeds a value indicative of the presence of electrical noise in the application (e.g. >5 state cycles/second).

State transitions (i.e. OFF-ON or ON-OFF) whose average rate (transitions/sec) exceeds a value indicative of the presence of electrical noise in the application (e.g. >50 state transitions/second).

If one or more of the above criteria are met, then controller 70 commands switch S1 of impedance adjusting circuit 82 to set the impedance across the logic device 66 input terminals 46 and 54 to the smallest available impedance value (most power consumption, most electrical noise immunity). The controller 70 also reports to external systems via the controller 70 outputs 74 that the impedance of the logic device 66 input has been reduced.

The controller 70 also monitors the logic signals from logic device 66 for changes in output state that meet one or more of the following criteria (Note that the values shown in the criteria are not limited to the examples given but must be appropriately selected by the system designer for the application being considered).

Short duration (e.g. less than 50 millisecond) state cycles (i.e. OFF-ON-OFF or ON-OFF-ON) whose average rate (state cycles/sec) are less than a value indicative of the absence of electrical noise in the application (e.g. <0.01 state cycles/second).

State transitions (i.e. OFF-ON or ON-OFF) whose average rate (transitions/sec) are less than a value indicative of the absence of electrical noise in the application (e.g. >0.01 state transitions/second).

If both criteria are met, then the controller 70 commands switch S1 of impedance adjusting circuit 82 to set the impedance across the logic device 66 input terminals 46 and 54 to the largest available impedance value (least power consumption, least electrical noise immunity). The controller 70 also report to external systems via controller 70 outputs 78 that the impedance of the logic device 66 input terminals 46 and 54 has been increased (repeat algorithm 74).

Note that the algorithms 74 described above provide a method for control of an impedance adjusting circuit 82 switch S1 that can select one of two different impedance values for the logic device 66. However, it should be understood that the algorithm 74 can be easily be extended by someone skilled in the art to control an impedance adjusting circuit 82 having one or more switches S1 capable of selecting one of more than two impedance values for the logic device 66. The use of more impedance values can provide finer control of power dissipation with respect to the state of the electrical noise environment.

The impedances of logic device 66 found in the examples have been of a resistive or ohmic type. However, it should be understood that the impedances may have a component that is reactive (either capacitive or inductive). Using reactive impedances with or in substitute for some of the impedances shown in the examples may be advantageous to improvement of signal integrity and would be understood by those skilled in the art.

Although specific example embodiments of the invention have been disclosed, persons of skill in the art will appreciate that changes can be made to the details described for the specific example embodiments, without departing from the spirit and the scope of the invention.

We claim:

1. A dynamic digital input filtering system comprising:
    a power supply;
    a remote device having a two-state switch;
    a logic device having an impedance adjusting circuit electrically in series with the power supply and the two-state switch of the remote device, the logic device producing a logic signal based on a binary signal sent by the two-state switch of the remote device; and
    a control device monitoring the logic signal of the logic device and adjusting the impedance of the impedance adjusting circuit in response to a change of state of the monitored logic signal.

2. A method for dynamically filtering noise at a discrete digital input/output device comprising the steps of:
    monitoring, by a controller, a logic signal produced by a logic device in response to a binary signal received from a remote device at an input terminal of an impedance adjusting circuit of the logic device;
    detecting, by the controller, a change in state of the logic signal;
    initiating, by the controller, a momentary change in the impedance of the impedance adjusting circuit;
    monitoring, by the controller, the logic signal for a change in state during the momentary change in impedance;
    determining, by the controller, if the monitored change of state of the logic signal was due to a change in state of the received binary signal.

\* \* \* \* \*